US011736268B2

(12) United States Patent
Christensen et al.

(10) Patent No.: US 11,736,268 B2
(45) Date of Patent: Aug. 22, 2023

(54) CLOCK RECOVERY

(71) Applicant: L3Harris Technologies, Inc., Melbourne, FL (US)

(72) Inventors: L. Carl Christensen, South Jordan, UT (US); Reed P. Tidwell, Centerville, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/519,219

(22) Filed: Nov. 4, 2021

(65) Prior Publication Data

US 2023/0134827 A1  May 4, 2023

(51) Int. Cl.
*H03D 3/24* (2006.01)
*H04L 7/04* (2006.01)

(52) U.S. Cl.
CPC ................. *H04L 7/041* (2013.01)

(58) Field of Classification Search
CPC .............. H04L 7/041; H04J 3/0691
USPC ............... 375/262, 371, 373–376
See application file for complete search history.

(56) References Cited

U.S. PATENT DOCUMENTS

| 6,038,267 | A | 3/2000 | Oura et al. |
| 9,455,667 | B2 | 9/2016 | Vlachogiannakis et al. |
| 2003/0161430 | A1 | 8/2003 | Sou |
| 2012/0039426 | A1 | 2/2012 | Onodera |
| 2016/0373245 | A1* | 12/2016 | Fukano .............. H04J 3/0691 |

OTHER PUBLICATIONS

Taylor et al., "All Digitial VCXO Replacement for Gigabit Transceiver Applications (7Series/Zynq-7000)," XAPP589 (v2.3) Apr. 29, 2015 (31 pages).
Hanumolu et al., "A Wide-Tracking Range Clock and Data Recovery Circuit," IEEE Journal of Solid-State Circuits, vol. 43, No. 2, pp. 425-439 (Feb. 2008).
Extended European Search Report for European Patent Application No. 22 20 4574, dated Mar. 9, 2023 (7 pages).

* cited by examiner

*Primary Examiner* — Phuong Phu
(74) *Attorney, Agent, or Firm* — Fox Rothschild LLP; Carol Thorstad-Forsyth (57) ABSTRACT

Clock recovery from a serial data signal involves using a serializer/deserializer (SERDES) to produce a clock signal which periodically alternates between high and low output clock values. These high and low clock values are generated by outputting for each clock period a series of N digital bits including a plurality of low-level bits to form each low output clock value and a plurality of high-level bits to form each high output clock value. A sync pulse obtained from a sync word present in each frame of the serial data signal is used to periodically determine a frequency error of the clock signal. The frequency error is used as a basis to change a phase of the adjusted clock signal responsive to the frequency error.

25 Claims, 9 Drawing Sheets

CLOCK RECOVERY

BACKGROUND

Statement of the Technical Field

The technical field of this disclosure concerns recovery at a receiving station of a reference clock associated with a source of serial data.

Description of the Related Art

Clock recovery is performed in serial data communication systems to facilitate decoding of received data symbols. This process often involves use of a Phase Locked Loop (PLL) system and complex loop control processing. Although effective, these conventional systems for clock recovery can increase the size, weight, and power requirements of the communication system. There are alternative solutions to the clock recovery problem that use all-digital clock synthesis with fine timing involving delay elements. However, these types of clock recovery systems are generally useful only for communication of relatively low speed data. For example, these types of clock recovery methods are mainly useful for data rates in the range of a few hundred megahertz, and do not facilitate fine resolution adjustability.

SUMMARY

This document concerns a method for clock recovery from a serial data signal. The method involves producing a clock signal which periodically alternates between high and low output clock values. These high and low clock values are generated by outputting for each clock period a series of N digital bits including a plurality of low-level bits to form each low output clock value and a plurality of high-level bits to form each high output clock value. A value of N is selected to be an integer multiple of a clock frequency of the clock signal. The method further involves using a sync pulse obtained from a sync word present in each frame of the serial data signal to periodically determine a frequency error of the clock signal. The frequency error is used as a basis to selectively change a phase of the adjusted clock signal responsive to the frequency error.

In a solution disclosed herein the phase of the clock signal is changed by selectively modifying a pattern of the series of N digital bits. A frequency of the clock signal is changed by repeatedly adjusting the phase of the clock signal over a period of time. According to one aspect, the series of N digital bits is produced using a serializer/deserializer (SERDES) circuit.

Phase positions of the clock signal are advantageously specified by a plurality of predetermined phase index values. Further, a rate of change in the clock frequency is specified using a phase slip rate comprising a magnitude and sign. The magnitude indicates a rate at which the phase index value is changing, and the sign indicates whether the phase index value is advancing or retreating over time.

According to one aspect, the frequency error can be determined based on an interval error value. This value specifies a difference between an expected time duration between successive ones of the sync word pulses and an actual time duration between successive ones of the sync word pulses. In some scenarios, this interval error value can be determined by counting a number of clock periods between the sync word pulses, and then determining the difference between the number of clock periods expected between the sync word pulses and the number of clock periods counted between the sync word pulses. The frequency error can be determined based on a plurality of the interval error values which are successively determined over time. In some scenarios, the interval error values can be advantageously excluded from the plurality of interval error values which are used to determine the frequency error if the interval error values exceed a maximum predetermined value. Further, the method can involve leaving the phase slip rate unchanged if the frequency error is within a predetermined range which defines a dead zone.

A solution disclosed herein also concerns a system for recovering a clock timing from a serial data signal. The system includes a serializer/deserializer (SERDES) circuit as described above. The SERDES is configured to produce a clock signal which periodically alternates between high and low output clock values by outputting for each clock period a series of N digital bits including a plurality low-level bits to form each low output clock value and a plurality of high-level bits to form each high output clock value. The system includes an interval counter. The interval counter is configured to utilize a sync word pulse produced from a sync word present in each frame of the serial data signal. The interval counter is configured to count a number of clock periods between the sync word pulses. The frequency error is based on an interval error value specifying a difference between a number of clock periods expected between the sync word pulses and the number of clock periods counted between the sync word pulses.

A clock adjustment control unit is provided which is responsive to the frequency error for determining a phase slip rate. The phase slip rate is comprised of a magnitude value and a sign. A SERDES control unit is configured to cause the SERDES circuit to selectively change a phase of the clock signal responsive to the phase slip rate.

In the disclosed system, the SERDES circuit is configured to change the phase responsive to the SERDES control unit by selectively modifying a pattern of the series of N digital bits. Further, the SERDES circuit is configured to change a frequency of the clock signal by repeatedly adjusting the phase of the clock signal over a period of time. According to one aspect, a plurality of phase positions of the clock signal are specified by a plurality of predetermined phase index values, and the magnitude of the phase slip rate indicates a rate at which a phase index value is changing. Further, the sign indicates whether the phase index value is advancing or retreating over time.

BRIEF DESCRIPTION OF THE DRAWINGS

This disclosure is facilitated by reference to the following drawing figures, in which like reference numerals represent like parts and assemblies throughout the several views. The drawings are not to scale and are intended for use in conjunction with the explanations in the following detailed description.

DETAILED DESCRIPTION

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in various different scenarios. Further, particular features described herein can be used in combination with other described features in each of the various possible combinations and permutations. It is noted that various features are described in detail with reference to the drawings, in which like reference numerals represent like parts and assemblies throughout the several views. While the various aspects are presented in the drawings, the drawings are not necessarily drawn to scale unless specifically indicated.

The methods and/or systems disclosed herein may provide certain advantages in a data communication system. Clock recovery is often performed in serial data communication systems to facilitate decoding of received data symbols. In such systems, a serial data receiver communicates with a remote source comprising a receiving device. The receiving device has nominally the same clock frequency as the transmitter in such a system, but the receiver clock is often generated based on its own, local oscillator. Therefore, the clocks in the transmitter and the receiver are not synchronous, and may have a slight difference in frequency, on the order of tens of parts per million (ppm). In addition, there could be Doppler effects that cause further frequency differences between the remote transmitter source and the local receiver. Accordingly, an adjusted clock is needed at the receiver which tracks the frequency and phase of the remote source. Conventional methods and systems for facilitating such an adjusted clock can have various deficiencies regarding the size, weight, and power requirements necessary to implement such systems.

A clock recovery solution described herein produces an adjusted clock for use in various applications, such as a demodulator of a data receiver. The clock recovery system can provide an adjusted clock signal which tracks the frequency and phase of a source clock associated with a remote transmitter. The clock recovery system comprises a clock generator, and a clock rate control section. The clock generator is comprised of a serializer/deserializer (SERDES). The SERDES advantageously operates at a substantially higher rate as compared to the base clock frequency of the demodulator. The use of the SERDES facilitates precise variation and control of the clock period associated with the adjusted clock. The arrangement also facilitates an adjusted clock in which jitter is minimized to a sufficient extent to satisfy the requirements of certain sensitive components in the data receiver.

According to one aspect, a phase slip clock generation scheme is used to produce the adjusted clock. The clock period of the adjusted clock (relative to the reference clock) is determined by a phase slip rate input which facilitates changes in very precise increments involving a very small fraction of a given clock period of the adjusted clock. A clock rate control circuit implements a simple and effective clock adjustment algorithm that changes the frequency of the adjustable clock at certain intervals (e.g., several times per minute). According to one aspect, the changes applied to the adjustable clock are based on a comparison of the spacing of waveform sync pulses with the expected spacing. There are proportional and differential aspects to the control algorithm. In this way, a locked, stable, frequency-tracking clock is produced for use by the data recovery logic.

Figure 1:
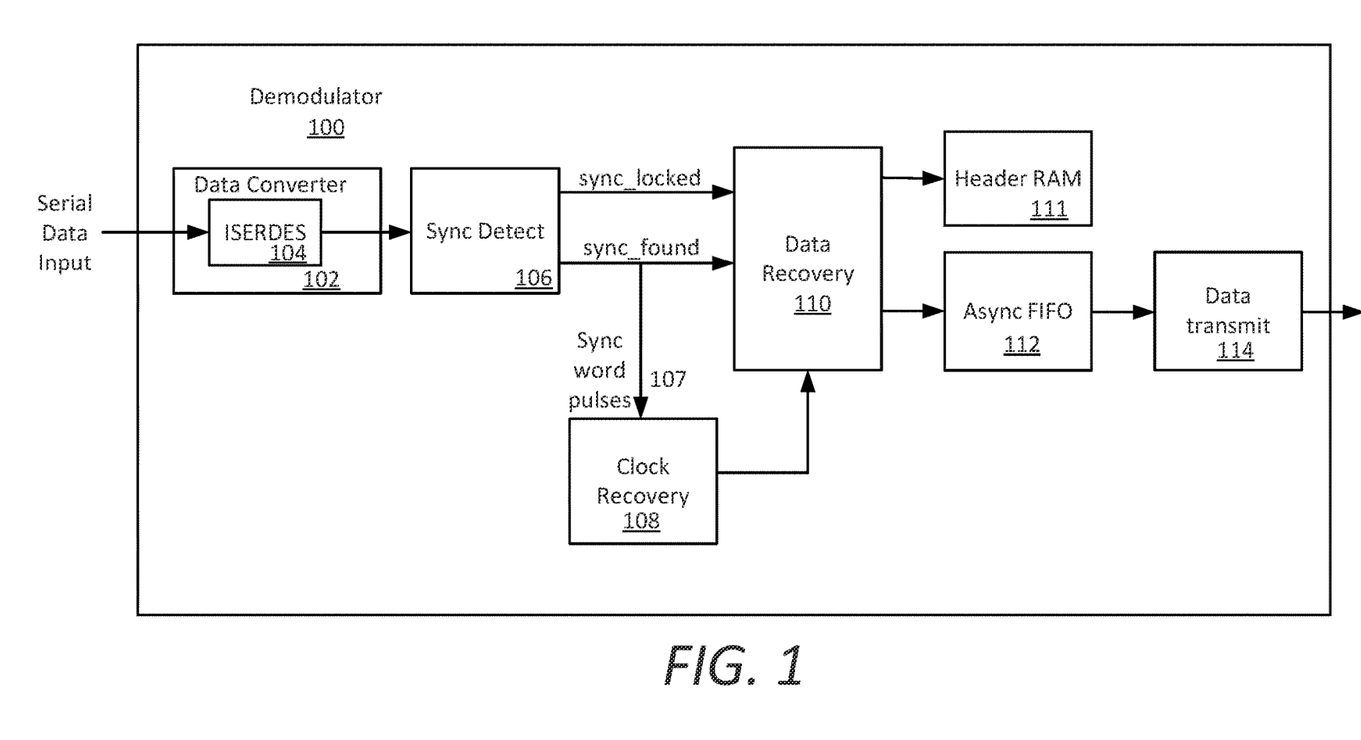
FIG. 1 is a block diagram of a demodulator which is useful for understanding a context in which a clock recovery system can be used.

An example of a serial data demodulator 100 is shown in FIG. 1. The serial demodulator in this example demodulates a received serial data input signal. In some scenarios, the serial data input signal can be derived from a received RF signal and/or a received optical signal. A modulation scheme may be employed to encode the digital data stream onto carrier waves. Where optical signals are employed, this modulation scheme can include but is not limited to pulse position modulation (PPM) or other modulation technique. In PPM scenarios, the encoding is achieved by modulating the optical carrier waves such that the digital data bits are conveyed through variations in a time relationship between optical pulses. Major functional blocks of the demodulator 100 comprise data converter 102, sync detector 106, clock recovery 108, data recovery 110, header RAM 111, Async FIFO 112 and data transmit 114. In some scenarios, the data converter 102 can include an inverse serializer/deserializer (SERDES) 104.

Figure 2:
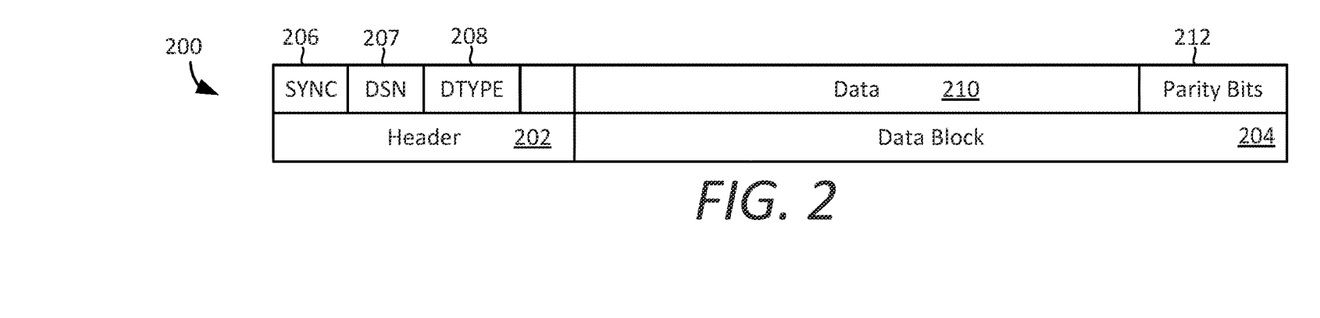
FIG. 2 is a drawing that is useful for understanding a structure of a data frame used in a serial data communication system.

FIG. 2 shows an example waveform comprised of a data frame 200 which is useful for understanding certain operations of the demodulator 100. The data frame 200 is one possible example of a data frame that can be used and is not intended to be limiting to the operations of the demodulator 100 or clock recovery block 108. The data frame 200 is comprised of a header 202 and a data block 204. The header can include a sync word 206 comprised of a series of bits. In some scenarios, the sync word can be relatively long (e.g., 192 bits) but the solution is not limited in this regard. The demodulator 100 may perform certain synchronization operations by determining locations of a sync word within the received data stream. The sync word comprises a fixed pattern of bits inserted into a header of each frame by the transmitting device. This determination is made by matching the fixed pattern of bits in the received signal to a reference pattern of bits. The pattern matching may be achieved using any known or to be known pattern matching technique.

The header 202 can also include various other information in defined data fields. For example, this information can include a data sequence number (DSN) 207 which is incremented for each frame, and a data type (DTYPE) 208 which indicates a type of data contained in the data block 204. Forward Error Correction (FEC) may be employed to facilitate detection and correction of errors in transmitted data without the need for retransmission. An FEC code can be sent along with each discrete frame to facilitate error detection and decoding of encoded data by the receiving device's FEC decoder. For example, in some scenarios, the data block 204 can be comprised of a low-density parity-check (LDPC) code block comprised of data 210 and parity bits 212.

In some scenarios, the serial data input to the demodulator can be comprised of a plurality of data frames 200. If the received signal is an optical signal, then the incoming serial data can be converted from an optical signal to an electrical signal by a photodetector (not shown). In some scenarios, the optical signal can be a modulated in accordance with a PPM type modulation scheme.

The incoming serial data stream is communicated to data converter 102 which includes the ISERDES 104. As is known, a serializer/deserializer (SERDES) is a device or system that converts parallel data to serial data. The ISERDES 104 refers to an inverse SERDES which converts serial data to parallel data. SERDES and ISERDES are well-known and therefore will not be described here in detail. However, it will be understood that a serial data input signal will be received by the data converter 1-bit at a time in accordance with a predetermined clock rate. The ISERDES can be configured to convert the incoming serial data to digital words comprised of a plurality of bits. For example, the ISERDES can convert blocks of incoming serial data to 4-bit words at a predetermined output rate. The resulting 4-bit words are communicated to the sync detect block 106 which identifies the presence of the sync word 206 each time that the sync word is present in incoming data. Each time the sync word is detected, a sync found signal is communicated to clock recovery block 108 and data recovery block 110. The sync detect block can also generate a sync_lock signal to indicate that sync detector 106 has locked onto the periodic repeating occurrence of the sync word 206.

The clock recovery block 108 produces an adjusted clock signal which tracks the frequency and phase of a source clock associated with the source of the serial data that is received by the demodulator. This adjusted clock is communicated to the data-recovery block 110 which uses the adjusted clock to facilitate extraction of data from the incoming serial data. Extracted data can then be communicated by the data-recovery block 110 to header random access memory (RAM) 111 and Async FIFO 112. Additional FEC and data recovery steps can then be performed. For example, in some scenarios data recovery block 110 can extract or recover data from the low-density parity-check (LDPC) data block 204.

Figure 3:
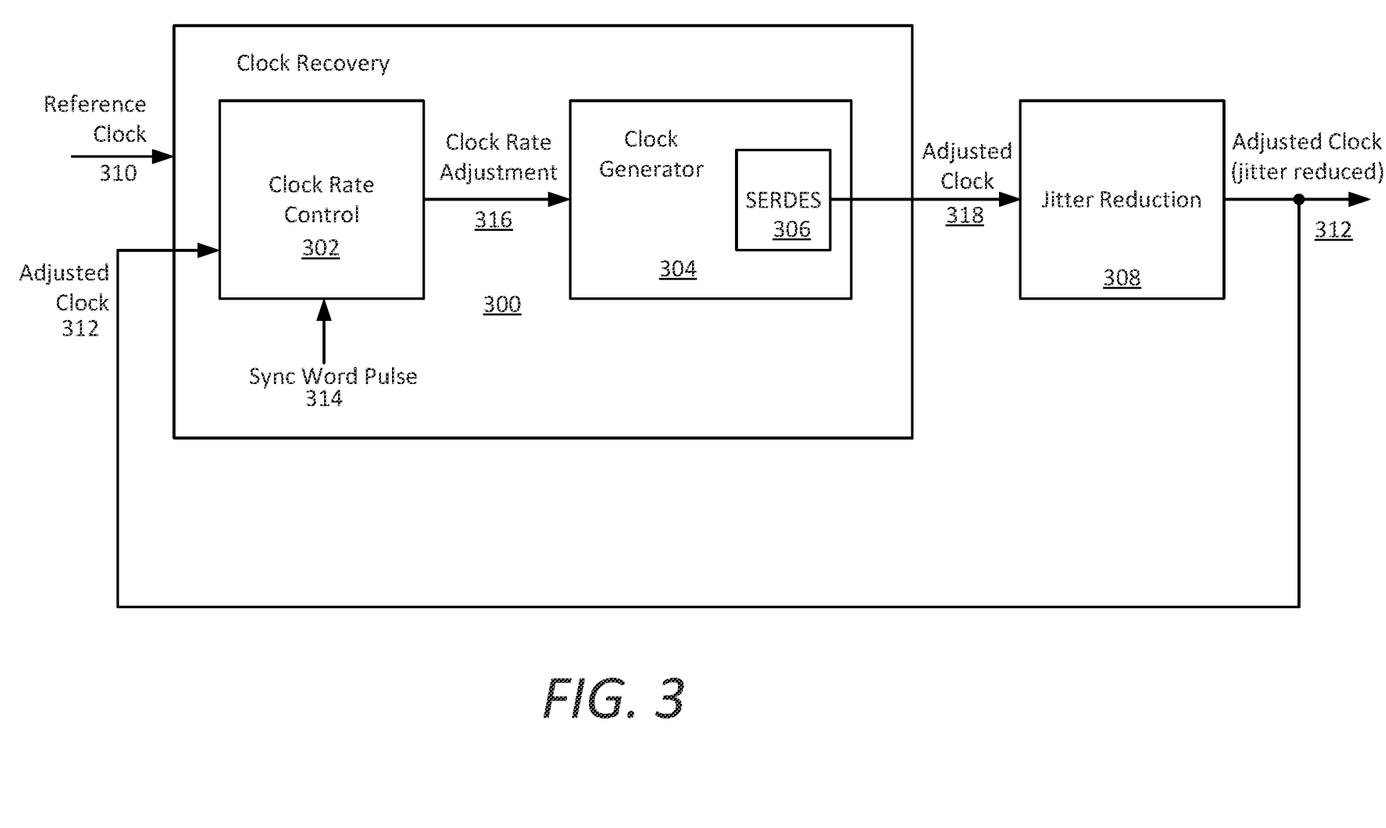
FIG. 3 is a block diagram that is useful for understanding a clock recovery system.

Shown in FIG. 3 is a clock recovery system 300. In some scenarios, the clock recovery system 300 can be used to implement the clock recovery 108 in a demodulator 100. The clock recovery system 300 can also be used in any other system where clock recovery is required. Accordingly, the solution is not limited to applications involving a demodulator. In some scenarios, the clock recovery system 300 can be implemented in a commercial off-the-shelf (COTS) digital logic platform such as a Field Programmable Gate Array (FPGA) which includes a variety of different resources that may be utilized by a designer.

The clock recovery system 300 is comprised of two main functional blocks or components which are shown in FIG. 3. These functional blocks include the clock rate control 302 and the clock generator 304. The clock generator 304 produces an adjusted clock with very fine frequency adjustments which allow it to run at frequencies slightly faster or slightly slower than the reference clock. The clock rate control block 302 is comprised of a control loop that makes fine adjustments to the frequency of the adjusted clock produced by the clock generator 304. The clock recovery system 300 can optionally also include a third functional block for jitter reduction. In some scenarios, the jitter reduction block 308 can comprise a digital clock manager (DCM) or a phase locked loop (PLL). DCMs and PLLs are known in the art and are commonly included in many FPGA modules. Accordingly, these devices will not be described here in detail. It is sufficient to note that the jitter reduction block 308 advantageously functions to further reduce the presence of jitter in the adjusted clock signal prior to the adjusted clock being used in subsequent operations to sample the input data stream. Each of the components of the clock recovery system is discussed below in greater detail.

The clock rate control unit 302 receives three inputs that it uses as a basis to generate a clock rate adjustment signal 316 for controlling the clock generator 304. Clock rate control unit 302 receives a reference clock signal 310, a sample clock signal 312, and a sync word pulse signal 314. The reference clock signal 310 and the sample clock signal 312 each comprise a signal that oscillates between a high and a low value (e.g., to form a square wave) at a specified rate. In some scenarios, the reference clock 310 can be generated locally with respect to the clock recovery system 300 by a conventional clock source (not shown). In a scenario involving a demodulator 100 that is used within a data transceiver (not shown), the same reference clock signal used by the clock recovery system 300 can optionally also be used by a transmitter component (not shown) to facilitate generation of transmitted serial data.

The clock generator 304 produces an adjusted clock signal 318 which has a frequency and phase that are determined by the clock rate controller. Within the clock generator 304, the adjusted clock is advantageously generated by a SERDES 306. A SERDES is commonly included in many commercially available digital logic platforms including FPGAs. Although commonly included in such platforms, experience has shown that SERDES resources are often underutilized or not used at all. In such scenarios, implementing an adjusted clock using the SERDES can provide a mechanism for producing an adjusted clock signal with practically no increase in system weight or size and only a very small increase in power. Accordingly, the use of the SERDES for the purpose of implementing an adjustable clock can be highly efficient from a design standpoint. In the present solution, the SERDES generates an adjusted clock signal which periodically alternates between high (1) and low (0) values by outputting a series of digital bits to form each high and low clock value. The SERDES generates a plurality of low-level bits which together form a continuous uninterrupted low output (0) of the adjusted clock 318. The plurality of low-level bits are then followed by a plurality of high-level bits. The plurality of high-level bits together form a continuous uninterrupted high-level output of the adjusted clock 318. This pattern of high and low outputs from the SERDES define the adjusted clock. To accomplish the foregoing, the SERDES advantageously operates at an internal clock rate which is N times higher than the rate or frequency of the reference clock 310. In some scenarios, the internal clock signal can be generated by hardware components provided within the SERDES and thus does not require extra system resources beyond that included with the digital logic platform.

The exact value of N that is used for various embodiments is not critical but should result in the SERDES generating output bits at a clock rate that is significantly higher than the rate or frequency of the reference clock 310. Further, the value of N should be an even integer value. For example, in some scenarios, the value of N can be 8, 16, 32 or 64. The exact value of N that is selected will depend on various factors including the available hardware capabilities, the level of clock precision that is required, and the frequency or rate of the reference clock. To facilitate description of a solution herein, the value of N is assumed to be 16. However, embodiments are not limited in this regard and other rates are also possible.

In a scenario where the value of N is selected to be 16, the SERDES can generate output bits at a rate that is 16X the frequency of the reference clock 310. Thus, if the reference clock rate is set at 350 MHz, then SERDES 306 will operate at an internal clock rate of 350 MHz×16=5.6 GHZ. Accordingly, SERDES 306 can in some scenarios be capable of operating at speeds in the multi-gigabit range. In such a scenario, where N=16, the SERDES will alternately output eight zeros followed by eight ones to produce its adjusted clock 318 output. The resulting adjusted clock 318 output waveform will be a 350 MHz 50% duty cycle clock. If a different value of N is selected in a particular embodiment, the bit pattern output from the SERDES would be selected. For example, if the value of N was chosen to be 8, then the SERDES would alternately output four zeros followed by four ones to produce its adjusted clock output, for a total of eight bits.

In a solution described herein, a frequency adjustment of the adjusted clock 318 is performed by occasionally slipping the adjusted clock output by one bit. In this way, the clock frequency can be adjusted slightly, in small incremental steps determined by the value of N. For example, in a scenario where the value of N=16, the adjusted clock can be varied in steps of only 1/16 of the clock period. Following such adjustment, the adjusted clock 318 can be communicated to jitter reduction block 308 before being used (e.g., used to sample the input serial data stream in demodulator 100).

Figure 4:
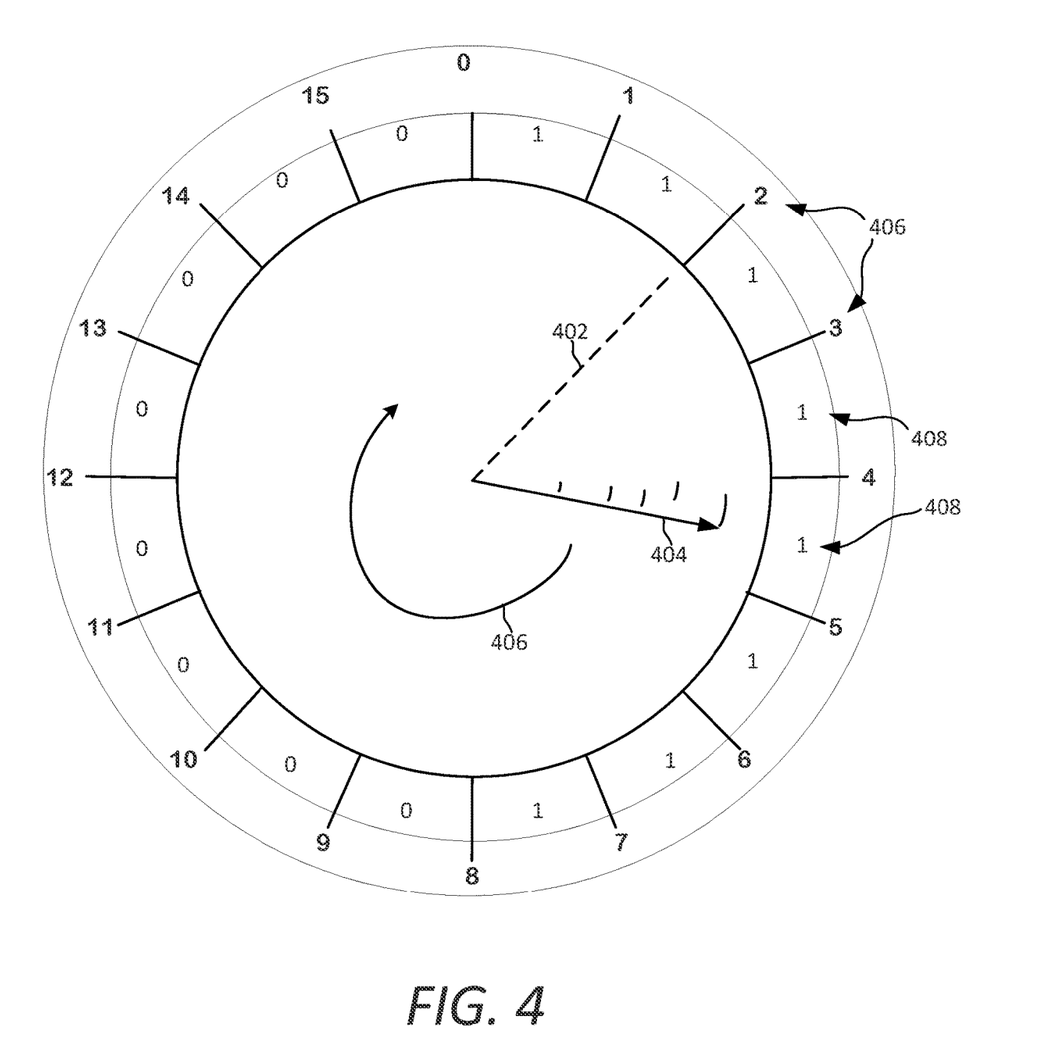
FIG. 4 is a diagram that is useful for understanding a phase control technique which can be used in a serializer/deserializer (SERDES) functioning as a clock generator.

In a solution which is described herein, the output of the SERDES 306 can be thought of as comprising a rotating phase pointer. FIG. 4 illustrates this concept with reference to the example above where N=16. In FIG. 4 the numbers in the outer ring ranging from 0 to 15 define a phase index value 406 corresponding to a phase position. The zeros and ones in the inner ring represent the high and low SERDES output values 408 associated with each phase position. It can thus be observed that the output of SERDES 306 will repeatedly rotate through a cycle of the 1111 1111 0000 0000 pattern in accordance with a position of phase pointer 404.

When necessary, the phase of the 1111 1111 0000 0000 pattern output by the SERDES can be adjusted as needed. Repeatedly adjusting the phase facilitates a precisely controlled change in the adjusted clock frequency. This idea is conceptually illustrated in FIG. 4. For this example, assume that the current state of the output pattern from the SERDES 306 is such that the phase index value is 2. This phase condition is indicated by phase line 402. However, control inputs indicate that a different phase is needed. In such a scenario, the phase pointer is instantaneously slipped from phase line 402 to a different phase position (either position 1 or 3). When the phase pointer 404 completes its current rotation back to phase index value 2, it will immediately jump to the new phase index value to begin its next cycle, rotating through the SERDES output values. This advancement or rotation of the phase pointer 404 through the SERDES output values is conceptually indicated by the arrow 406.

In the example shown in FIG. 4, the phase pointer 404 is shown to be advancing relative to the expected phase position indicated by line 402. However, the solution is not limited in this regard and it should be understood that the he modified phase of the adjusted clock output from the SERDES (as represented by the phase pointer 404) can be advanced or retarded relative to the expected phase position indicated by line 402. With a solution disclosed herein, the phase index value can be advanced in in increments of one in either direction. This action effectively involves advancing or retarding the phase of the 1111 1111 0000 0000 pattern by a single clock cycle. In the scenario shown in FIG. 4, the SERDES is operated at a clock cycle that is 16 time the rate of the reference clock (N=16). So, slipping the phase pointer 404 by one increment (e.g. by setting the phase pointer to phase index value 3 instead of an expected phase index value 2) will effectively adjust the phase of the 1111 1111 0000 0000 pattern by 1/16 cycle in this example. In a similar way, the frequency or rate of the adjusted clock is adjusted by slipping the phase at selected intervals.

The concept illustrated in FIG. 4 may also be understood with reference to Table 1 which lists as an example a plurality of binary SERDES output patterns corresponding to each of a plurality of phase index values in a scenario where N=16. Also listed in Table 1 is a hexadecimal value corresponding to each of the listed binary SERDES values.

TABLE 1

| Phase | Binary SERDES pattern | Hex |
| --- | --- | --- |
| 0 | 1111 1111 0000 0000 | FF00 |
| 1 | 1111 1110 0000 0001 | FE01 |
| 2 | 1111 1100 0000 0011 | FC03 |
| 3 | 1111 1000 0000 0111 | F807 |
| 4 | 1111 0000 0000 1111 | F00F |
| 5 | 1110 0000 0001 1111 | E01F |
| 6 | 1100 0000 0011 1111 | C03F |
| 7 | 1000 0000 0111 1111 | 807F |
| 8 | 0000 0000 1111 1111 | 00FF |
| 9 | 0000 0001 1111 1110 | 01FE |
| 10 | 0000 0011 1111 1100 | 03FC |
| 11 | 0000 0111 1111 1000 | 07F8 |
| 12 | 0000 1111 1111 0000 | 0FF0 |
| 13 | 0001 1111 1110 0000 | 1FE0 |
| 14 | 0011 1111 1100 0000 | 3FC0 |
| 15 | 0111 1111 1000 0000 | 7F80 |

As shown in Table 1, the adjusted clock output 318 produced by the SERDES 306 is a series of 16-bit words, each with 8 zeros and 8 ones. When the phase index value is set to zero, the binary SERDES output pattern is 1111 1111 0000 0000. However, if the phase index value is subsequently changed to 1, then the SERDES output pattern will change to 1111 1110 0000 0001 in the next cycle. This change will effectively adjust the phase of the 1111 1111 0000 0000 pattern by 1/16 cycle. In a scenario as described herein where N=16, the phase index value can vary from zero to 15. In other scenarios, where a different value of N is selected, the phase index value can vary over a different range. The phase index value which is specified determines the resulting 16-bit pattern output from the SERDES 306 in the next cycle of the pattern.

Figure 5A:
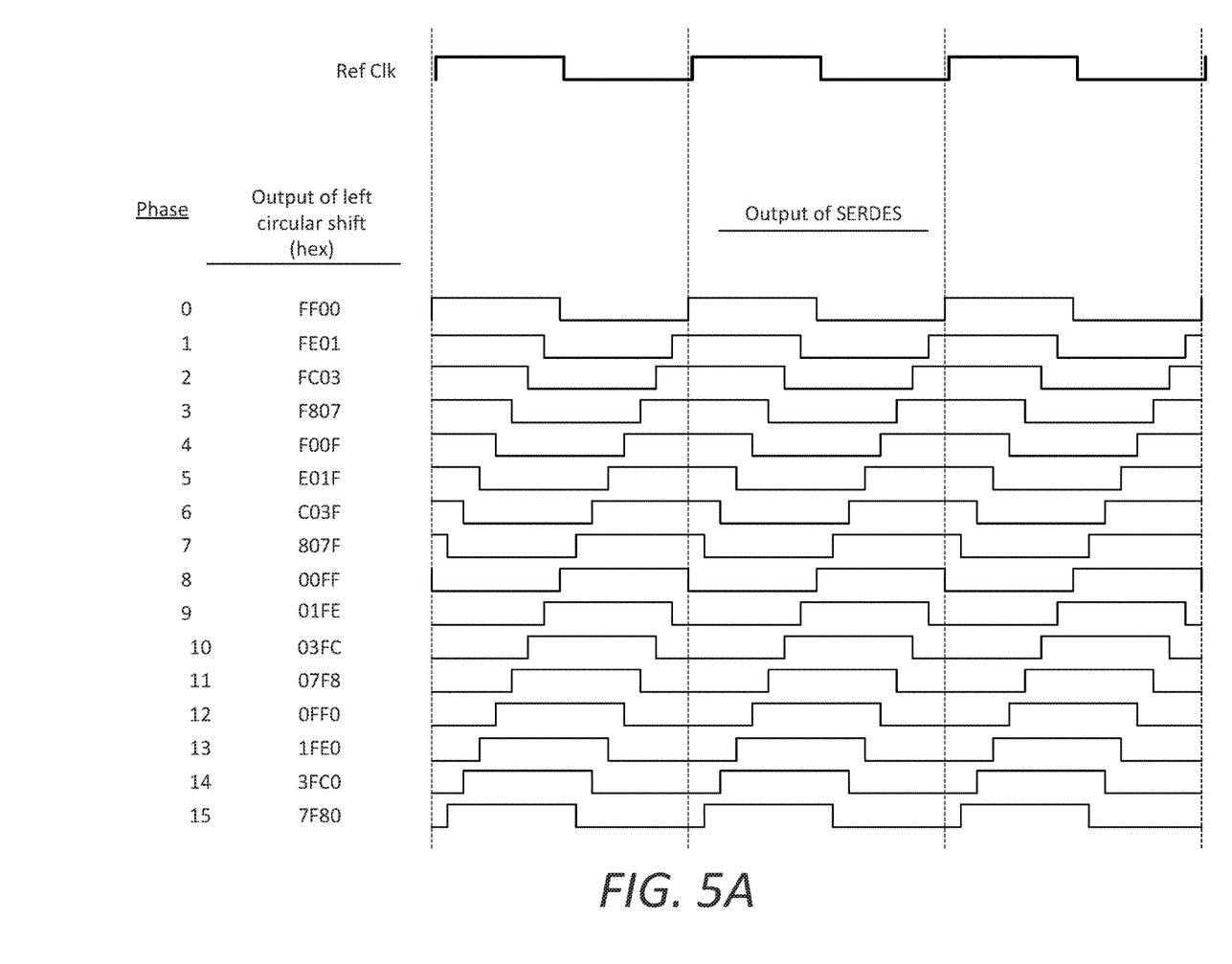
FIG. 5A is a timing diagram which shows an adjusted clock compared to a reference clock for each of a plurality of different phase index values.
Figure 5B:
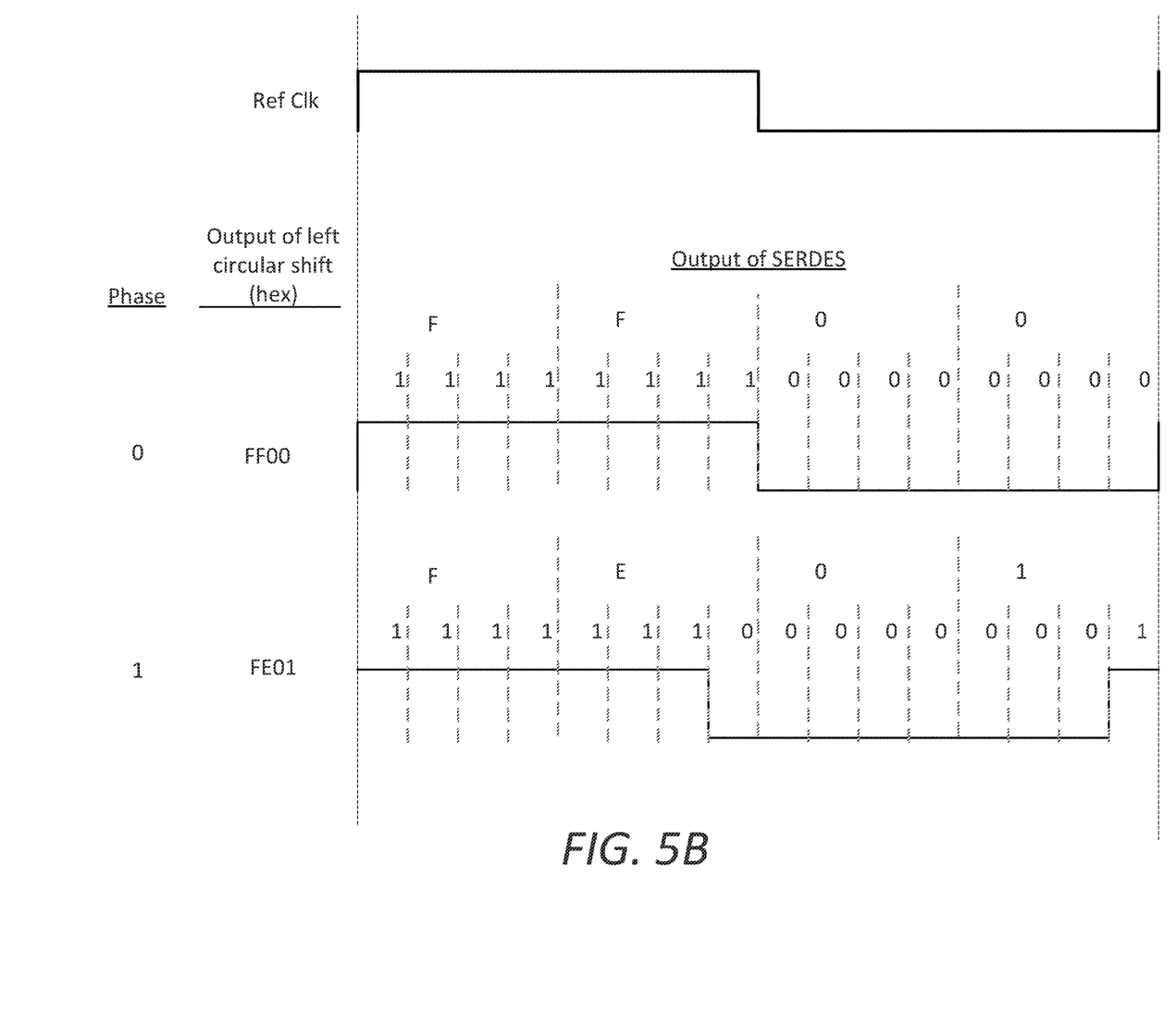
FIG. 5B is an enlarged timing diagram which shows the adjusted clock compared to one cycle of the reference clock for phase index values of zero and one.
Figure 6A:
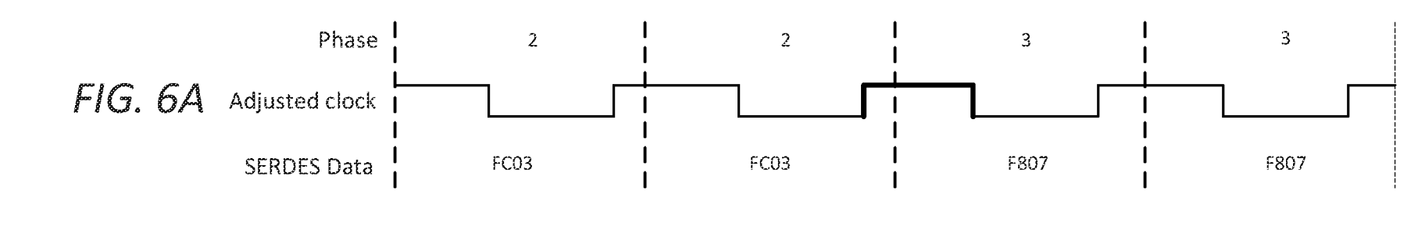
FIGS. 6A-6D are a series of drawings which includes several examples of a clock signal where a phase slip technique is used to shorten or lengthen a particular clock pulse.
Figure 6B:
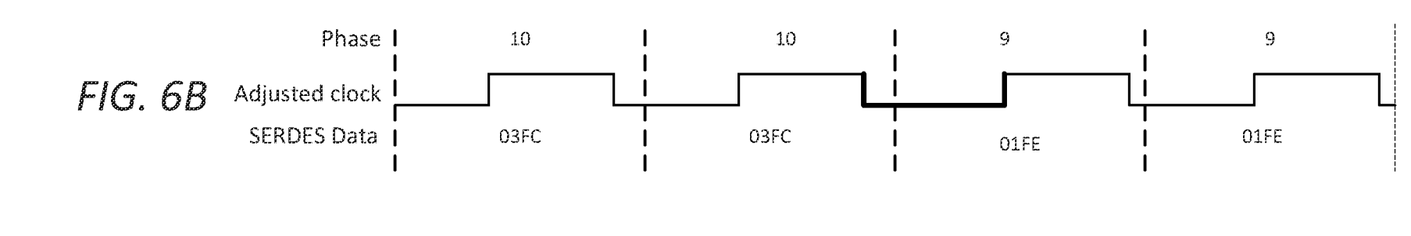
Figure 6C:
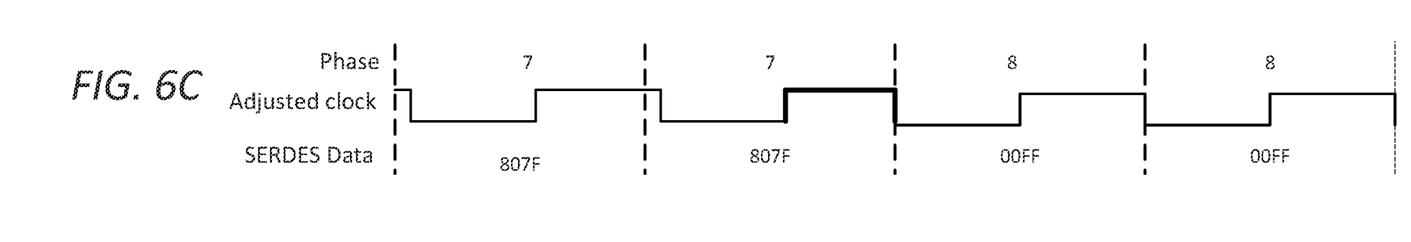
Figure 6D:
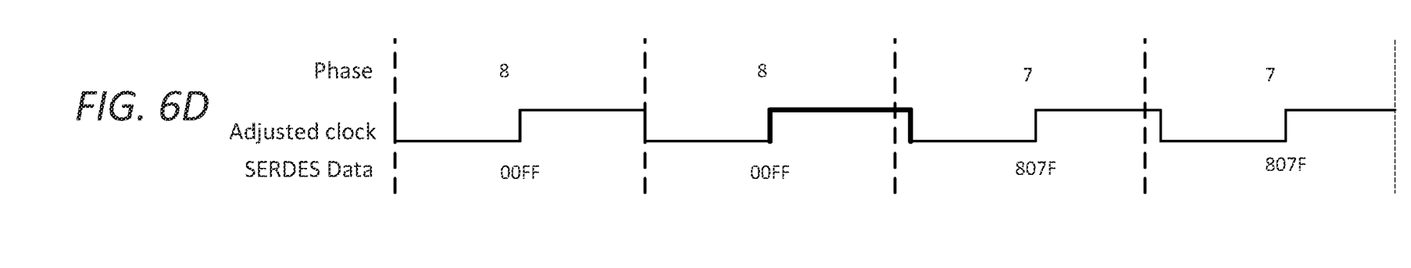

The concept is illustrated in FIGS. 5A and 5B. The timing diagram in FIG. 5A shows the phase shift of the adjusted clock output produced by the SERDES compared to the reference clock for each phase index value listed in Table 1. Also shown in FIG. 5A is the hex control output which is used to control the SERDES. This hex control output and associated SERDES control unit is described below in greater detail in relation to FIG. 7. The timing diagram in FIG. 5B is an enlarged timing diagram which shows one cycle of the reference clock in FIG. 5A compared to the output of the SERDES (adjusted clock) for phase index values of zero and one. The timing diagram in FIG. 5B illustrates in further detail how the adjusted clock output is defined by the hex control value inputs that are applied to the SERDES FIGS. 6A-6D are a series of drawings showing some examples of how the phase slip transitions shorten or lengthen a particular clock pulse. In FIGS. 6A-6D, the corresponding phase index values are listed above the adjusted clock pulses. The clock pulse that is being adjusted in each case is indicated by a line of increased thickness. The hexadecimal value associated with the SERDES data is listed below each clock pulse. FIG. 6A shows a transition of the phase index value from 2 to 3. FIG. 6B shows a transition of the phase index value from 10 to 9. FIG. 6C shows a transition of the phase index value from 7 to 8. FIG. 6D shows a transition of the phase index value from 8 to 7.

The rate at which the phase index value of the adjusted clock 312 is changing (advancing or retarding) relative to the reference clock 310 is referred to herein as a "phase slip rate". According to one aspect, the phase slip rate can be a signed value to indicate which direction the phase is moving. The signed value is comprised of a magnitude and a sign which together define the phase index value. Positive phase slip rate (phase index advancing) is equivalent to running the adjusted clock at a higher frequency than the reference clock. The adjusted clock proceeds through each of its cycles faster than the reference clock. Negative phase slip rate (phase index retarding) is equivalent to running the adjusted clock at a lower frequency as compared to the reference clock. The adjusted clock proceeds through each of its cycles more slowly than the reference clock.

From the foregoing it may now be understood that there are several advantages to using the SERDES for purposes of generating an adjusted clock signal. As explained above, the SERDES operates at a rate that is many times the reference clock generator frequency. As such, its use in the manner described herein facilitates very fine and precise clock period adjustments of the adjusted clock signal. For example, in the example embodiment described, the adjustment is exactly 1/16 of the nominal period of the reference clock. This adjustment can be made to a single clock cycle at a time, thereby facilitating a very high degree of control over the adjusted clock.

Further, the utilization of a SERDES for generating an adjusted clock is superior as compared to conventional methods of clock adjustment which sometimes involve a digital clock manager (DCM) or a PLL circuit. Conventional methods of clock adjustment performed by a DCM will usually change the clock frequency by inserting or removing a delay element to the clock generation loop. But this conventional approach to clock adjustment has no relation to the generated clock and therefore has various disadvantages. Also, in the DCM the delay element must be inserted or removed from a long sequence of clock cycles, so the DCM does not have the granularity to change only a single clock cycle at a time.

Alternative clock adjustment methods involving a PLL are also inferior to the SERDES approach described herein. A PLL changes the clock period relatively slowly, over time, and in response to a reference that is much slower than the output clock. This means the output clock cannot adjust quickly or with high granularity. The DCM and PLL are beneficial for jitter reduction and can be used in a jitter reduction module 308 for this purpose. But both a DCM and PLL lack the very fine grained and precise control that is provided by the SERDES-generated clock. Thus, they are not suitable for implementing the phase slipping technique described herein.

A further advantage of using the SERDES to generate an adjusted clock involves better utilization of available resources in a digital logic platform such as an FPGA. As is known, a commercial off-the-shelf (COTS) digital logic platform such as an FPGA will typically include a variety of different resources that may be utilized by a designer. But experience has shown that the SERDES resource that is commonly included in such devices is often unused. Accordingly, implementing an adjustable clock in a SERDES in the manner described herein not only facilitates improvements in control over the adjusted clock signal, but it makes use of an existing resource that is often available but not used in COTS digital logic platforms. Consequently, in a system such as a demodulator or clock recovery system that is already utilizing a COTS digital logic platform for other purposes, the adjustable clock can be implemented with no increase in weight or size and only a very small increase in power.

Figure 7:
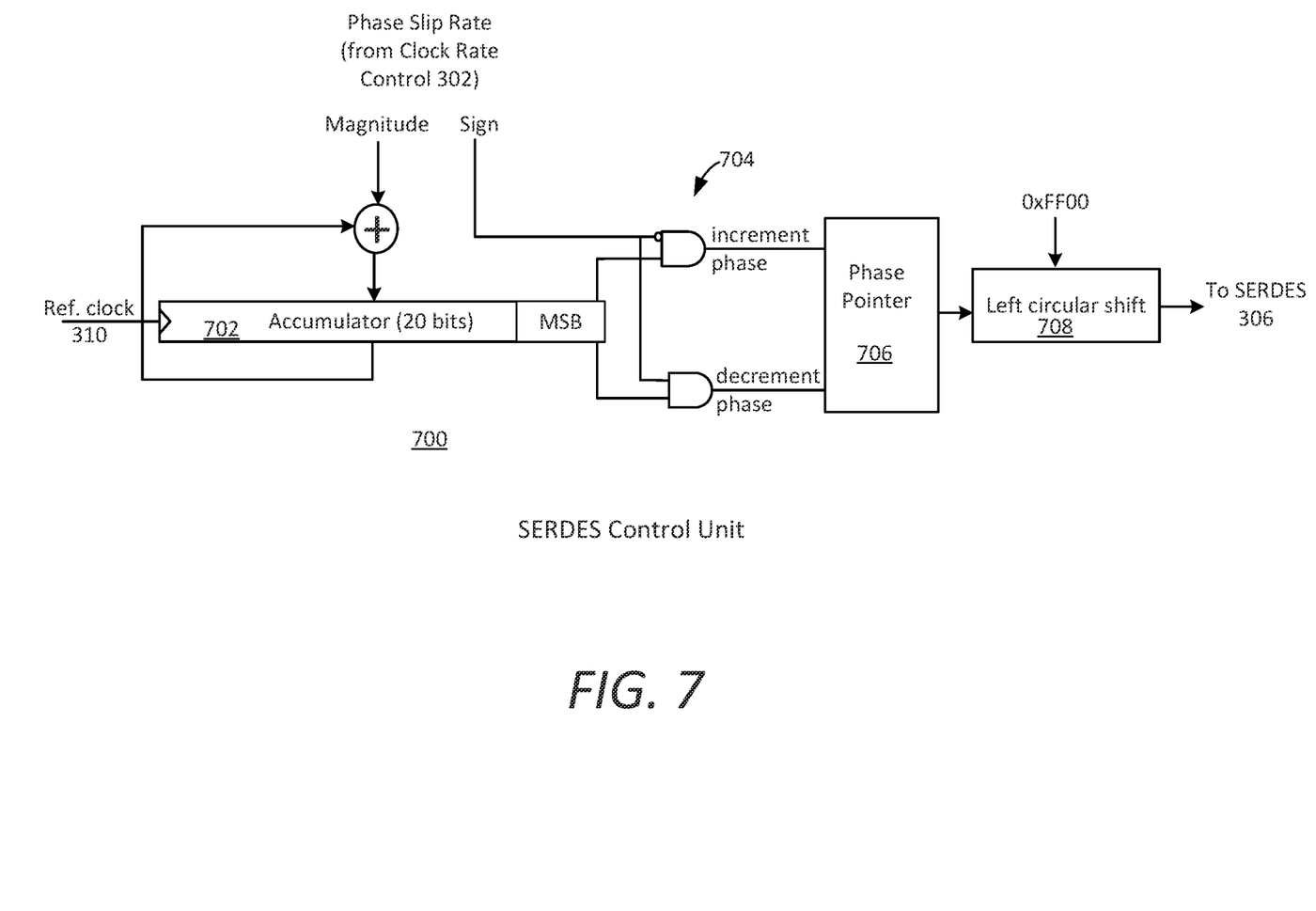
FIG. 7 is a block diagram of a SERDES control unit.

FIG. 7 shows one example of a SERDES control unit 700 that may be used to control the SERDES 306 based on the phase slip rate. The solution is not limited in this regard and the solution shown in FIG. 7 is merely one possible example of a SERDES control unit. In some scenarios, SERDES control unit 700 can be included as part of the clock generator 304. Inputs to the SERDES control unit include the reference clock 310 and the phase slip rate (magnitude and sign). It may be noted that in the SERDES control unit, adjustments made to the phase slip rate are performed in the reference clock domain.

In the example shown, the unit 700 includes an accumulator 702 and an up/down counter 704. In accordance with the output of the up/down counter 704, a phase index value specified by phase pointer 706 changes by one increment upon each occurrence of the accumulator 702 rolling over. For example, the phase pointer 706 can increment each time that the most significant bit (MSB) of the accumulator 702 changes from 0 to 1. Accordingly, the number of bits which can be stored in the accumulator 702 will determine the step size of the phase slip rate.

The phase pointer 706 control the output of the left circular shift register 708. The purpose of the left circular shift register is to shift the nominal bit pattern (hex FF00) to create the bit pattern for the SERDES so that it that will output the phase of the adjusted clock according to the phase pointer. The resulting hex output value from the left circular shift register is communicated to the SERDES for controlling its output. This way in which the hex output is used to vary the phase of the adjusted clock is illustrated in FIGS. 5A and 5B.

Equation (1) represents the frequency of the adjusted clock 318:

$$F_{adj} = F_{ref} * (1(P_{sr}/2^A/N)) \quad (1)$$

where:

$F_{adj}$ is the frequency of the adjusted clock;
$F_{ref}$ is the frequency of the reference clock;
$P_{sr}$ is the phase slip rate is the rate at which the phase index value is to change;
A is the accumulator size specifies the number of bits stored in the accumulator;
N is an integer value specifying a multiple of the reference clock rate, where the SERDES clock rate is N times higher than the rate or frequency of the reference clock Equation (1) can be used to determine the resulting frequency step size which can be achieved with the clock recovery system described herein. For example, assume that the accumulator size 502 is 20 bits, and the value of N is 16.

In that case, the frequency step size is $½^20/16=0.06$ ppm. The foregoing calculation may be understood by recognizing that the accumulator in this example is 20 bits, so the range of values represented is $220=2^20=1,048,576$. Therefore, one step (changing a value of 1) is 1/1,048,576 of the full range. There are 16 phases in a cycle of the reference clock, so one step of the phase accumulator represents 1/16 of a clock cycle.

A phase slip of 1/16 of a clock period happens when the accumulator fills up and "rolls over". For example, at a phase slip rate of 1, the accumulator increases by 1 at every ref clock. This means that the MSB output of the accumulator will go from 0 to 1 every $2^20$ reference clocks. This rising edge of the MSB will cause a phase change of 1/16 of a reference clock cycle. Therefore, a frequency step of 1 bit (i.e the lsb of the phase slip rate) represents $(1/(2^20))*(1/16)=2/2^20/16=0.000000059604$=approximately $0.00000006=0.06$ parts per million (ppm).

Continuing with the foregoing assumptions, presented below are examples which demonstrate an adjusted clock rate which results based on a specified phase slip rate of +30 and −65.

Example 1

Phase slip Rate=+30

$F_{adj}=F_{ref}*(1+30/2^20/16)$ i.e. +1.8 ppm

Example 2

Phase slip rate=−65

$F_{adj}=F_{ref}*(1-65/2^20/16)$ i.e. −3.9 ppm

In this manner, the frequency of the adjustable clock can be very precisely controlled based on a phase slip rate.

Clock Rate Control

The phase slip rate input to the SERDES control unit 700 is provided by the clock rate control 302. The clock rate control 302 make changes to the phase slip rate as necessary to match as closely as possible the adjusted clock rate 312 to the clock rate of the incoming data. To perform this function, the clock rate control 302 can in some scenarios receive as inputs the reference clock 310, the adjusted clock 312 (which may be jitter reduced), and sync word pulses 107. The clock rate control 302 compares the period of the sync word pulses to the expected clock period as defined by the adjusted clock and in response makes changes to the phase slip rate as necessary. The changes to the phase slip rate are made to keep the adjusted clock running at the proper rate for good data recovery.

Figure 8:
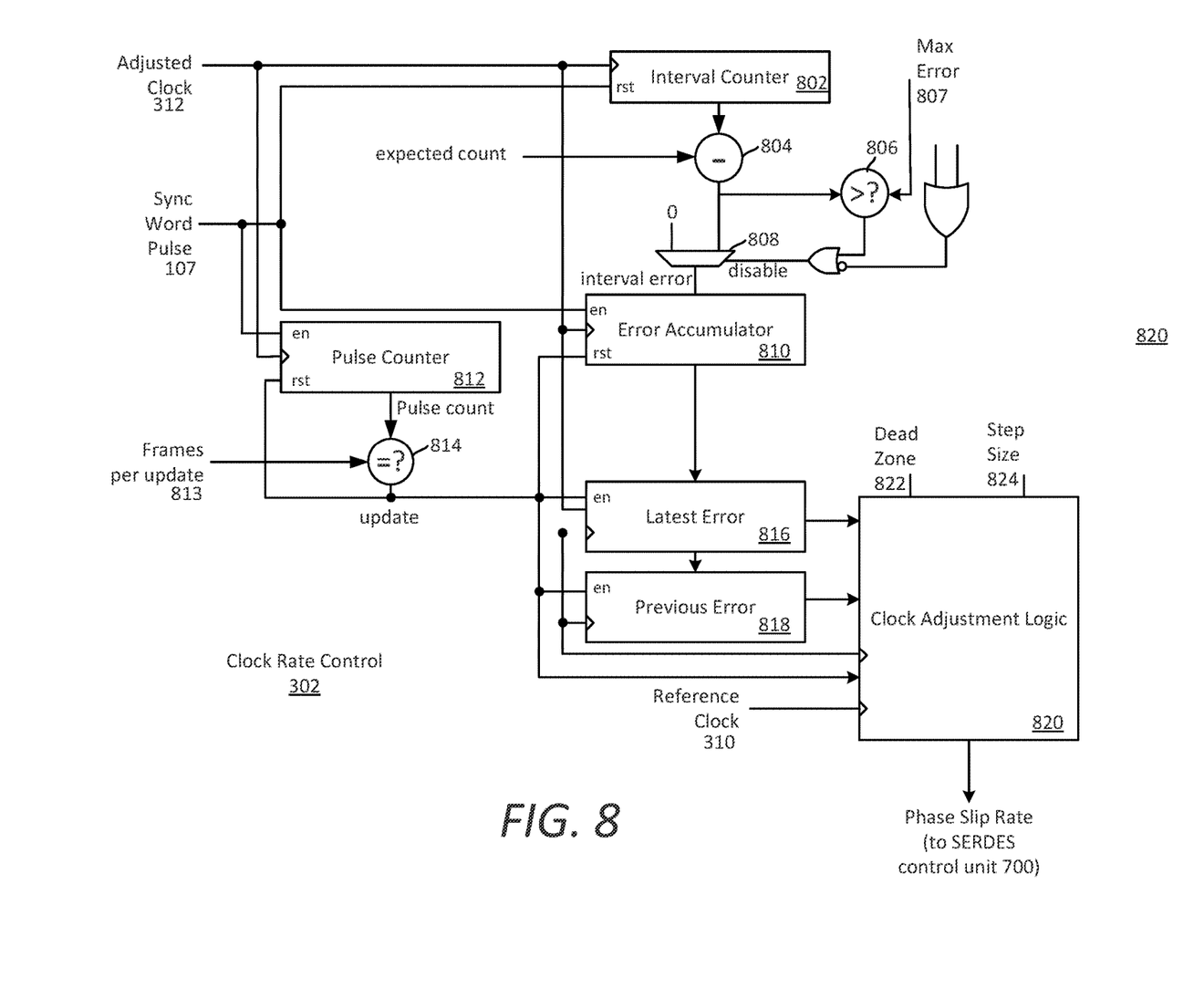
FIG. 8 is a block diagram of a clock rate control unit.

Referring now to FIG. 8, one example architecture of a clock rate control 302 is illustrated. The solution is not limited in this regard and other clock rate control solutions are also possible. Accordingly, the clock rate control 302 that is shown in FIG. 8 is presented as merely one possible configuration of a clock rate control that can be used with the SERDES 306. The clock rate control 302 includes interval counter 802, subtracter 804, an interval error disable system comprised of an error detection unit 806 and disable component 808. The system further includes error accumulator 810, pulse counter 812, update trigger unit 814, latest error register 816 and previous error register 818. Outputs of latest and previous error registers are provided to clock adjustment logic 820 as shown. The clock adjustment logic 820 uses this information to determine the phase slip rate. Additional inputs to the clock adjustment logic include the reference clock 310, a dead zone parameter 822 and a step size parameter 824.

In the clock rate control 302, the interval counter 802 uses the adjusted clock 312 to count an interval between each pair of sync word pulses 107. The interval is counted, and the error is determined in the adjusted clock domain. This contrasts with the SERDES control unit, in which clock adjustments via the phase slip rate are done in the reference clock domain. At each sync pulse, the interval count from interval counter 802 is communicated to the subtracter 804 where the interval count is compared to the expected count. The difference between the two values is the interval error that is added to the error accumulator 810. An interval error of one means that the data recovery position has changed by one clock period of the adjusted clock 312. The interval error is a proxy value which corresponds to a frequency error of the adjusted clock relative to the clock timing of the serial data. Accordingly, the interval error can be used in the clock rate control 302 as a basis for making changes or adjustments to the adjusted clock.

It may be appreciated that in the case of temporary loss of signal, the sync word pulse will not be present. Consequently, the interval error value which is output from the subtracter 804 could have a large discrepancy. In such scenarios, the interval error information is not useful for adjusting the frequency of the adjusted clock. Likewise, during initial signal acquisition there may be no sync word pulses or the sync word pulses could be very irregular. This can also lead to erroneous interval error data. Therefore, it is useful to detect such conditions whereby the resulting aberrant interval error can be ignored. This is accomplished at error detection unit 806 by comparing the interval error to a predetermined max error threshold value 807. If the max error threshold value is exceeded, the error detection unit 806 uses disable component 808 to force the interval error to zero. The zero-value applied to the error accumulator during those conditions ensures that the adjustable clock frequency is unchanged and not adversely affected because of the aberrant conditions.

The error accumulator 810 accumulates the count error over some number of data frames. The number of data frames over which the error count is accumulated is defined as the frames per update and is set by a frames per update value 813. The pulse counter 812 increments once for each sync word pulse. The number of frames per update defines the update interval:

Update interval=frames per update*frame interval

The update interval is so named because it is the interval between possible updates to the phase slip rate and results in frequency changes to the adjustable clock. There are two factors which may be considered regarding the length of the update interval. The update interval should be (1) long enough to obtain an accurate error count and (2) long enough for any clock adjustment to take effect. In some scenarios, the first consideration will be dominant as the actionable errors will be in fractions of ppm (parts per million) frequency differences.

The update trigger unit 814 compares the value of the pulse count produced by pulse counter 812 to the frames per update value. When the value of the pulse count determined by the pulse counter 812 is equal to the value specified by the frames per update value 813, the update signal is asserted. The update signal causes the error accumulator value (i.e., the number of errors accumulated in the update interval) to be loaded from the error accumulator 810 into the latest error register 816. The update signal also resets the error accumulator 810 and the pulse counter 812. Finally, the update signal also causes the previous error register 818 to be loaded with the value from the latest error register 816. In this manner, the period error (specified in terms of one or more integer periods defined by the adjusted clock 312) is stored every update period.

Clock Adjustment Logic

The clock adjustment logic 820 implements the control algorithm that controls the clock frequency of the adjustable clock. The purpose of the algorithm is to lock onto an asynchronous clock at a remote source of a data transmitter where the frequency is assumed to be stable and known within tens of ppm. More sophisticated variations of this algorithm (for example, multiple zones with varying gain) can be implemented, if necessary, for frequency slewing conditions, such as Doppler.

The clock adjustment logic 820 can comprise one or more components such as a processor, an application specific circuit, a programmable logic device, or other circuit programmed to perform the functions described herein. The system can be realized in one computer system or several interconnected computer systems. Any kind of computer system or other apparatus adapted for carrying out the methods described herein is suited. In some scenarios, the computer system can have a computer program that can control the computer system such that it carries out the methods described herein.

Figure 9:
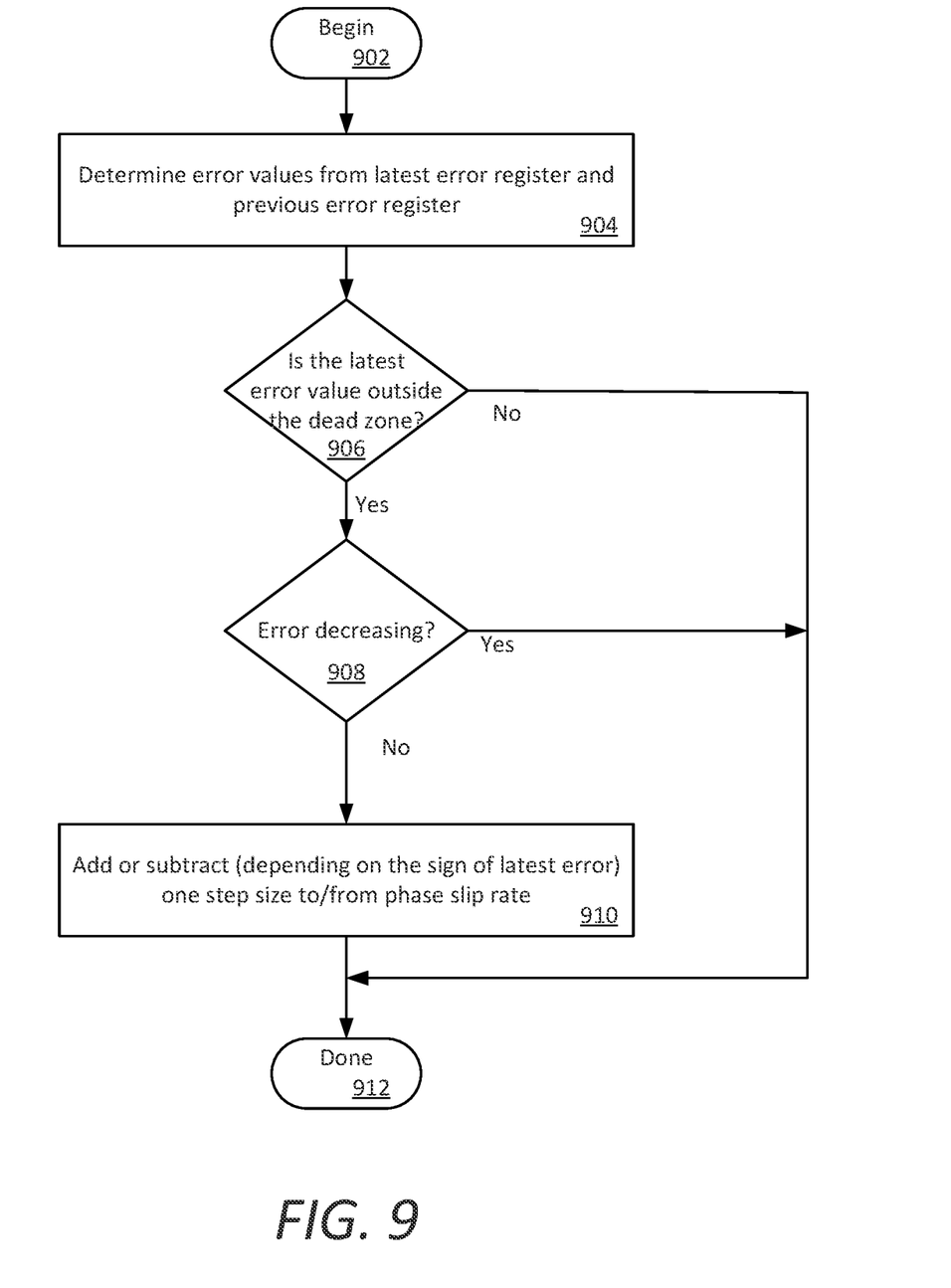
FIG. 9 is a flow chart that is useful for understanding an algorithm to facilitate clock recovery.

The basic operations of the clock adjustment logic are illustrated in the flowchart in FIG. 9. The process begins at 902 and continues to 904 where the latest error value is obtained from the latest error register 816 and the previous error value is obtained from previous error register 818. The latest error value is a proxy for the frequency error of the adjustable clock as compared to the ideal frequency. At 906 a determination is made as to whether the latest error value is outside a range specified by the dead zone parameter value. The dead zone represents a range of error values in which errors are considered too small to act upon. The dead zone parameter adds stability and avoids excess control action. The dead zone parameter sets a minimum value which the latest error must exceed if a correction is to be performed. The step size and error accuracy should be of high enough resolution such that the dead zone variation can be small enough that it lends to accurate data recovery.

If the latest error value is sufficiently large so that it is outside the dead zone range, a further evaluation is made at 908 to evaluate whether the magnitude of the frequency error is in the process of decreasing. This determination can be made based on a comparison of the latest error value to the previous error. If the latest error is greater than or equal to the previous error (i.e. error is not decreasing) then the process continues to 910 where one step size is added or subtracted (depending on the sign of latest error) to/from the phase slip rate. Following step 910, the system continues to perform additional processing or terminates at 912.

In some algorithms, the amount of change applied to the phase slip rate could be made proportional to the magnitude of the frequency error. However, it can be advantageous for an algorithm as disclosed herein to instead change the phase slip rate in a way that is not proportional to the amount of error. In such a scenario, if the single step change that is applied is subsequently found not to provide enough correction, the correction can be repeated by incrementally adding or subtracting additional step changes to the phase slip rate. When changing the phase slip rate in this way it is understood that larger errors will result in more correction steps in proportion to the magnitude of the error.

The requirement that the error not be decreasing is effectively the differential part of the algorithm, which adds dampening and stability. The intention is for the error trend to have as little slope as possible if it is not increasing. Conceptually, if the error is decreasing, it is headed in the right direction. Further or additional correction steps implemented when the error is not increasing would make the frequency error get to zero faster, but it also means that more corrective steps will be needed to correct the error in the opposite direction when the system overshoots. Therefore, for dampening purposes, it is advantageous to correct the error trend just enough that it is going in the right direction (decreasing), but at the shallowest slope possible.

In a solution as described herein, there are several parameters that affect the algorithm that can be tuned to achieve best performance. These parameters can be stored in registers and can be used to tune the response. The parameters include the number of data frames per update, the step size and the dead zone. Each of these parameters is discussed below in greater detail The frames per update parameter specifies the number of sync word pulses which must be detected before the occurrence of each error evaluation and associated update of phase slip rate. Increasing the value that is set for the frames per update parameter will correspond to increasing the number of frames per update and will result in a more accurate error determination which occurs over a longer period. Decreasing this parameter value will give less accuracy but a faster response for correcting any frequency errors that are detected. A suitable initial value for this parameter could be 256 sync pulses. However, the solution is not limited in this regard and other values can be set by a system designer.

The step size parameter defines the amount of adjustment which is applied to the phase slip rate at each update. This parameter is expressed in terms of phase slip count units. Smaller value step sizes will necessarily result in a finer control over the adjustment, but larger step size will result in a faster response. A suitable initial value for this parameter is 4 phase slip counts. However, the solution is not limited in this regard and other values can be set by a system designer.

The dead zone parameter specifies the error count range for which no adjustments are performed with respect to the phase slip rate. When error counts are within the range defined by the dead zone it is understood that the error is near zero. The dead zone parameter can be expressed in terms of error count units. As an example, in some scenarios a dead zone parameter can be initially set to define a range of +3 to −3 error count units. However, the solution is not limited in this regard and other values can be set by a system designer.

Table 2 below is an example which shows how the parameter values described herein can translate to real frequencies. In this example, the reference clock is assumed to have a frequency of 350 MHz.

TABLE 2

| Description | Absolute Value | ppm rel. to 350 MHz | Comments |
|---|---|---|---|
| Minimum freq. step | 20.9 Hz | .06 ppm | Determined by size of phase slip accumulator (20 bits, see FIG. 7) |

TABLE 2-continued

| Description | Absolute Value | ppm rel. to 350 MHz | Comments |
|---|---|---|---|
| Step size | 83.4 Hz | .24 ppm | Step size = 4 min steps |
| Dead zone | 156.0 Hz | .45 ppm | Based on dead zone of 3 to −3 (error range of 7). Sized such that two steps are sufficient to traverse the dead zone. |
| Number of frames to slip one clock per one step | 59.9 frames | — | This is the number of frames in which a change of one step results in an error of one. This suggests the frames per update needs to be several times this value to get a stable error count. |
| Update rate | 19.6 Hz | — | This represents a period of 256 frames of 70,000 clocks per frame. |

The architecture of demodulator 100 and clock recovery 300 as shown and described herein are presented as examples, but other configurations are also possible without limitation. Dedicated hardware implementations including, but not limited to, application-specific integrated circuits, programmable logic arrays, and other hardware devices can likewise be constructed to implement the methods described herein. Applications that can include the apparatus and systems of various embodiments broadly include a variety of electronic and computer systems. Some embodiments may implement functions in two or more specific interconnected hardware modules or devices with related control and data signals communicated between and through the modules, or as portions of an application-specific integrated circuit. Thus, the exemplary system is applicable to software, firmware, and hardware implementations. In some scenarios, the serial demodulator 100 and/or the clock recovery 300 can be implemented in one or more commercial off-the-shelf (COTS) digital logic platform such as an FPGA which includes a variety of different resources that may be utilized by a designer.

Further, embodiments can take the form of a computer program product on a tangible computer-usable storage medium (for example, a hard disk or a CD-ROM). The computer-usable storage medium can have computer-usable program code embodied in the medium. The term computer program product, as used herein, refers to a device comprised of all the features enabling the implementation of the methods described herein. Computer program, software application, computer software routine, and/or other variants of these terms, in the present context, mean any expression, in any language, code, or notation, of a set of instructions intended to cause a system having an information processing capability to perform a particular function either directly or after either or both of the following: a) conversion to another language, code, or notation; or b) reproduction in a different material form.

Furthermore, the described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for clock recovery from a serial data signal, comprising:
producing a clock signal which periodically alternates between high and low output clock values by outputting for each clock period a series of N digital bits including a plurality low-level bits to form each low output clock value and a plurality of high-level bits to form each high output clock value;
selecting a value of N to be an integer multiple of a clock frequency of the clock signal;
obtaining an error value for an interval between each pair of sync words present in a plurality of frames of the serial data signal;
selectively modifying the error value based on results from comparing the error value to a threshold value;
considering the error value as a proxy value for a frequency error of the clock signal; and
selectively changing a phase of the clock signal responsive to the frequency error.

2. The method of claim 1, wherein the phase is changed by selectively modifying a pattern of the series of N digital bits.

3. The method of claim 1, wherein the series of N digital bits is produced using a serializer/deserializer (SERDES).

4. The method of claim 1, wherein a frequency of the clock signal is changed by repeatedly adjusting the phase of the clock signal over a period of time.

5. The method of claim 1, wherein the integer multiple is an even integer multiple.

6. The method of claim 4, wherein a plurality of phase positions of the clock signal are specified by a plurality of predetermined phase index values, and further comprising specifying a rate of change in the clock frequency using a phase slip rate comprising a magnitude and sign.

7. The method of claim 6, wherein the magnitude indicates a rate at which the phase index value is changing, and the sign indicates whether the phase index value is advancing or retreating over time.

8. The method of claim 1, wherein error value specifies a difference between an expected time duration between successive ones of sync word pulses of the serial data signal and an actual time duration between successive ones of the sync word pulses.

9. The method of claim 8, further comprising counting a number of clock periods between the sync word pulses and determining the difference by comparing the number of clock periods expected between the sync word pulses and the number of clock periods counted between the sync word pulses.

10. The method of claim 1, wherein the error value is determined using the clock signal.

11. The method of claim 1, further comprising reducing a jitter present in the clock signal due to instantaneous phase changes.

12. The method of claim 1, wherein the frequency error is determined based on the error value and at least one other error value which are successively determined over time.

13. A method for clock recovery from a serial data signal, comprising:
  producing a clock signal which periodically alternates between high and low output clock values by outputting for each clock period a series of N digital bits including a plurality low-level bits to form each low output clock value and a plurality of high-level bits to form each high output clock value;
  selecting a value of N to be an integer multiple of a clock frequency of the clock signal;
  using a sync word pulse produced from a sync word present in each frame of the serial data signal to periodically determine a frequency error of the clock signal;
  selectively changing a phase of the clock signal responsive to the frequency error;
  wherein a frequency of the clock signal is changed by repeatedly adjusting the phase of the clock signal over a period of time, and a plurality of phase positions of the clock signal are specified by a plurality of predetermined phase index values;
  wherein the method further comprising specifying a rate of change in the clock frequency using a phase slip rate comprising a magnitude and sign, the magnitude indicating a rate at which the phase index value is changing and the sign indicates whether the phase index value is advancing or retreating over time; and
  wherein the method further comprising determining the frequency error based on an interval error value specifying a difference between an expected time duration between successive ones of the sync word pulses and an actual time duration between successive ones of the sync word pulses;
  wherein the interval error value is determined using the clock signal generated by the SERDES;
  wherein the interval error values are selectively excluded from the plurality of interval error values which are used to determine the frequency error if the interval error values exceed a maximum predetermined value.

14. A method for clock recovery from a serial data signal, comprising:
  producing a clock signal which periodically alternates between high and low output clock values by outputting for each clock period a series of N digital bits including a plurality low-level bits to form each low output clock value and a plurality of high-level bits to form each high output clock value;
  selecting a value of N to be an integer multiple of a clock frequency of the clock signal;
  using a sync word pulse produced from a sync word present in each frame of the serial data signal to periodically determine a frequency error of the clock signal; and
  selectively changing a phase of the clock signal responsive to the frequency error;
  wherein a frequency of the clock signal is changed by repeatedly adjusting the phase of the clock signal over a period of time;
  wherein a plurality of phase positions of the clock signal is specified by a plurality of predetermined phase index values; and
  wherein the method further comprises specifying a rate of change in the clock frequency using a phase slip rate comprising a magnitude and sign, and determining whether the frequency error is increasing or decreasing by comparing a latest value of the frequency error and a previous value of the frequency error.

15. The method of claim 14, further comprising selectively increasing or decreasing the phase slip rate responsive to the determination that the frequency error is increasing or decreasing.

16. The method of claim 15, further comprising increasing or decreasing the phase slip rate by only one step size each time a determination is made that the frequency error is increasing or decreasing.

17. The method of claim 6, further comprising leaving the phase slip rate unchanged if the frequency error is within a predetermined range.

18. A system for recovering a clock timing from a serial data signal, comprising:
  a serializer/deserializer (SERDES) circuit configured to produce a clock signal which periodically alternates between high and low output clock values by outputting for each clock period a series of N digital bits including a plurality low-level bits to form each low output clock value and a plurality of high-level bits to form each high output clock value;
  an interval counter configured to obtain an error value for an interval between each pair of sync words present in a plurality of frames of the serial data signal, the error value considered a proxy value for a frequency error of the clock signal and selectively modified based on results from comparing the error value to a threshold value;
  a clock adjustment control unit responsive to the frequency error for determining a phase slip rate; and
  a SERDES control unit configured to cause the SERDES circuit to selectively change a phase of the clock signal responsive to responsive to the phase slip rate;
  wherein a value of N is an integer multiple of a clock frequency of the clock signal.

19. The system of claim 18, wherein the SERDES circuit is configured to change the phase responsive to the SERDES control unit by selectively modifying a pattern of the series of N digital bits.

20. The system of claim 18, wherein the SERDES circuit is configured to change a frequency of the clock signal by repeatedly adjusting the phase of the clock signal over a period of time.

21. The system of claim 18, wherein the integer multiple is an even integer multiple.

22. The system of claim 18, wherein the phase slip rate is comprised of a magnitude value and a sign.

23. The system of claim 22, wherein a plurality of phase positions of the clock signal are specified by a plurality of predetermined phase index values, and the magnitude of the phase slip rate indicates a rate at which a phase index value is changing.

24. The system of claim 23, wherein the sign indicates whether the phase index value is advancing or retreating over time.

25. The system of claim 18, wherein the error value specifies a difference between a number of clock periods expected between sync word pulses of the serial data signal and the number of clock periods counted between the sync word pulses.

\* \* \* \* \*